United States Patent [19]

Delarue et al.

[11] 4,063,070
[45] Dec. 13, 1977

[54] WIDEBAND FREQUENCY MULTIPLIER PARTICULARLY ADAPTED FOR USE IN BADGE READERS AND THE LIKE

[75] Inventors: Gerard Jean-Marie Delarue, Antibes; Michel Paul Verhaeghe, Vence, both of France

[73] Assignee: International Business Machines Corporation, Armonk, N.Y.

[21] Appl. No.: 741,254

[22] Filed: Nov. 12, 1976

[30] Foreign Application Priority Data

Apr. 1, 1976  France ................. 76.10353

[51] Int. Cl.² .................. G06K 5/00; G11B 5/09
[52] U.S. Cl. ............................. 235/474; 360/51; 235/449
[58] Field of Search .......... 328/15; 235/61.11 D, 235/61.12 M, 61.7 B; 360/51, 2

[56] References Cited

U.S. PATENT DOCUMENTS

| 3,789,139 | 1/1974 | Negishi | 360/51 |
|---|---|---|---|
| 3,944,940 | 3/1976 | Deszi | 360/51 |

Primary Examiner—Vincent P. Canney
Attorney, Agent, or Firm—Wesley DeBruin

[57] ABSTRACT

An improved wideband frequency multiplier characterized as follows: a saw-tooth signal generator supplying a saw-tooth wave having a frequency equal to the frequency to be multiplied, the level of the voltage wave varying between a reference level and a maximum which is related to the frequency to be multiplied; storage means for storing a voltage equal to, or closely approaching the maximum voltage value of the saw-tooth wave; a voltage divider having several outputs, each of which provides an output which is a given fraction of the stored voltage; a number of comparators each of which corresponds to and is coupled to an output of the voltage divider, each comparator comparing the instantaneous value of the saw-tooth voltage with the voltage supplied by the corresponding output of the voltage divider, and supplying a first level signal when said instantaneous value is lower than the voltage supplied by said corresponding output, and a second level signal when it is higher; and logical circuits combining the signals supplied by the comparators so as to give an output signal the frequency of which is a given multiple of the frequency of the saw-tooth signal.

A timing circuit for a badge reader, or the like where the data is magnetically NRZ recorded on, or in, the badge, or the like. The timing circuit employs a frequency doubler as generally described above. The timing circuit also utilizes at least one additional logic circuit. The timing circuit provides timing signals synchronized with the reading of the data from the badge or the like.

16 Claims, 10 Drawing Figures

FREQUENCY DOUBLER

FIG. 6B

WIDEBAND FREQUENCY MULTIPLIER PARTICULARLY ADAPTED FOR USE IN BADGE READERS AND THE LIKE

BACKGROUND OF THE INVENTION

1. Field of the Invention

This invention is directed to a frequency multiplier capable of operating on a wide frequency range, and the practical application thereof to the generation of timing signals.

The wideband frequency multipliers in accordance with the invention is particularly necessary in data media reading devices wherein the reading operation requires a relative motion between the medium and the reading unit. These media are, generally, comprised of the data to be read as well as regularly-spaced marks intended to ensure the synchronization of the reading circuit operation with respect to the motion. The data reading units, or special units, read these marks and, from the periodic signal resulting from this reading operation, a frequency multiplier produces a timing signal the time-period of which is a submultiple of the periodic signal. The timing signal controls the various operating steps involved in the reading operation. Since the relative motion speed is varied, the time-period which is to be divided by the frequency multiplier will consequently be varied. This variation is of particular concern in applications where the data media is moved manually such as a badge reader. For example, in reading a badge, this speed may vary between about ten centimeters per second and more than one meter per second.

In such applications, it is apparent that the frequency multipliers based on the selection of the harmonics of a non-linear amplifier, cannot be efficiently utilized, if at all. When the speed variations are limited, as in magnetic tape drives, for example, systems may be used which are based on the synchronization of an oscillator by the signals resulting from the reading of magnetically recorded marks and/or data. The frequency variation range of an oscillator, however, is relatively quite limited. Thus, in the above-mentioned application of the reading of a badge, such a method or technique cannot be employed.

The frequency multiplier in accordance with the invention does not require any tuned circuit such as an oscillator requires. Nor does the frequency multiplier in accordance with the invention require a filter. Therefore, the frequency multiplier in accordance with the invention may operate on a very wide frequency range. It is based on a time measuring technique wherein a linearly varying voltage is compared with a reference voltage.

2. Description of the Prior Art

Reference is made to U.S. Pat. No. 3,585,502, entitled "Method and Apparatus for Subperiod Measurement of Successive Variable Time Periods" granted June 15, 1971 to Joseph W. Baker on application Ser. No. 749,142, filed July 31, 1968.

U.S. Pat. No. 3,585,502 is directed to a self-clocking method and apparatus for continuously detecting desired subperiods of time periods between successive pulses where the time periods may vary. The successive pulses indicate the start and stop of each time period. A switching network responds to the start-stop indications to generate a responsive signal, e.g., a ramp function signal. The characteristics of the ramp are dependent upon the start and stop indications. A comparator network compares the magnitude of the responsive signal to a reference signal stored from the preceding period.

Reference is made to U.S. Pat. No. 3,548,317, entitled "Time Division Frequency Multiplier" granted Dec. 15, 1970 to Michael P. Bordonaro on application Ser. No. 645,267, filed June 12, 1967.

U.S. Pat. No. 3,548,317 is directed to a frequency multiplier with an input frequency which is variable over one decade and in which input pulses reset a linear ramp voltage to a negative voltage level from which a ramp voltage increases to a positive level. The ramp voltage is applied to a zero crossing detector which changes state each time the ramp voltage crosses the zero voltage level. Each time the zero crossing detector changes state, an output pulse is provided at the output terminal. There are two such output pulses for each input pulse since the ramp voltage crosses zero during resetting of the ramp generator and as the ramp voltage builds up from its initial value.

Reference is made to U.S. Pat. No. 3,548,318, entitled "Ramp Function Generator", granted Dec. 15, 1970 to Daniel S. Yorksie, on application Ser. No. 755,857, filed Aug. 28, 1968.

U.S. Pat. No. 3,548,318 discloses a ramp function generator for providing a symmetrical saw-tooth voltage waveform in response to a square wave oscillator of the type having first and second switching devices which are alternately conductive. The ramp function generator includes first, second and third capacitors. The generator provides a saw-tooth voltage waveform having a frequency equal to twice that of the square wave oscillator, and synchronized therewith.

Reference is made to U.S. Pat. No. 3,970,828, entitled "System for Precision Time Measurement" granted July 20, 1976 to Albert M. Klein on application Ser. No. 540,332, filed Jan. 13, 1975.

The ABSTRACT of U.S. Pat. No. 3,970,828 reads as follows:

"A system for measuring a first period of time, for example a period between a pair of pulses, with an extraordinarily high degree of accuracy. Two ramp voltages of different slopes are started in synchronism with the first occurring pulse. The ramp with the largest slope is then sampled and held on receipt of the second occurring pulse. A counter counts a clock of a moderate pulse repetition frequency (PRF) during a second period occurring between the time the ramps are started and the time the amplitude of the ramp of the smaller slope becomes equal to the sampled amplitude of the ramp of the larger slope. The count stored in the counter at the end of the second period is then directly proportional to the first period or is equal thereto. Moreover, the count can be far more precise than it would be by counting the clock PRF during the first period. By making the larger ramp slope 1,000 times as large, for example, as the smaller ramp slope, the precision of the measurement may be increased 1,000 times for the same clock PRF."

SUMMARY OF THE INVENTION

The frequency multiplier in accordance with the invention does not require delicate adjustments and has the capability to multiply the reference frequency by any number to provide a resulting signal having either equal or unequal time-periods. The frequency multiplier in accordance with the invention, in addition to circuitry including a ramp function generator, also employs a multiple tap voltage divider and a plurality of comparators, associated with logic circuits which combine the signal obtained at the outputs of the various comparators.

The primary object of the invention is to provide a frequency multiplier operating on a wideband frequency range.

A significant object of the invention is to provide a wideband frequency multiplier having particularly advantageous utility when employed in a badge reader or the like.

A further object of the invention is to provide a frequency multiplier requiring neither tuned circuits nor synchronization circuits.

A still further object of the invention is to provide a frequency multiplier having a rapid synchronization capability and rapid resynchronization capability in response to reference frequency variation.

These objects, and others which will be apparent from the detailed description of the invention hereinafter are accomplished by practicing the invention summarized as follows:

a sawtooth signal generator produces a linearly varying periodic voltage the frequency of which is equal to the frequency to be multiplied; a storage device stores the maximum of this voltage or a value closely approaching the maximum; a voltage divider provided with a number of taps, each tap being associated with a comparator, each comparator compares the voltage value at its associated tap with the instantaneous voltage value of the sawtooth voltage and produces a signal when comparison occurs; logic devices combine these signals in order to form a periodic signal the frequency of which is a multiple of that of the input signal.

The invention will be further described hereinafter by way of a non-limitative example, with reference to the accompanying drawings.

The foregoing and other objects, features and advantages of the invention will be more apparent from the following more particular description of the preferred embodiment of the invention, as illustrated in the accompanying drawings.

Figure 1:
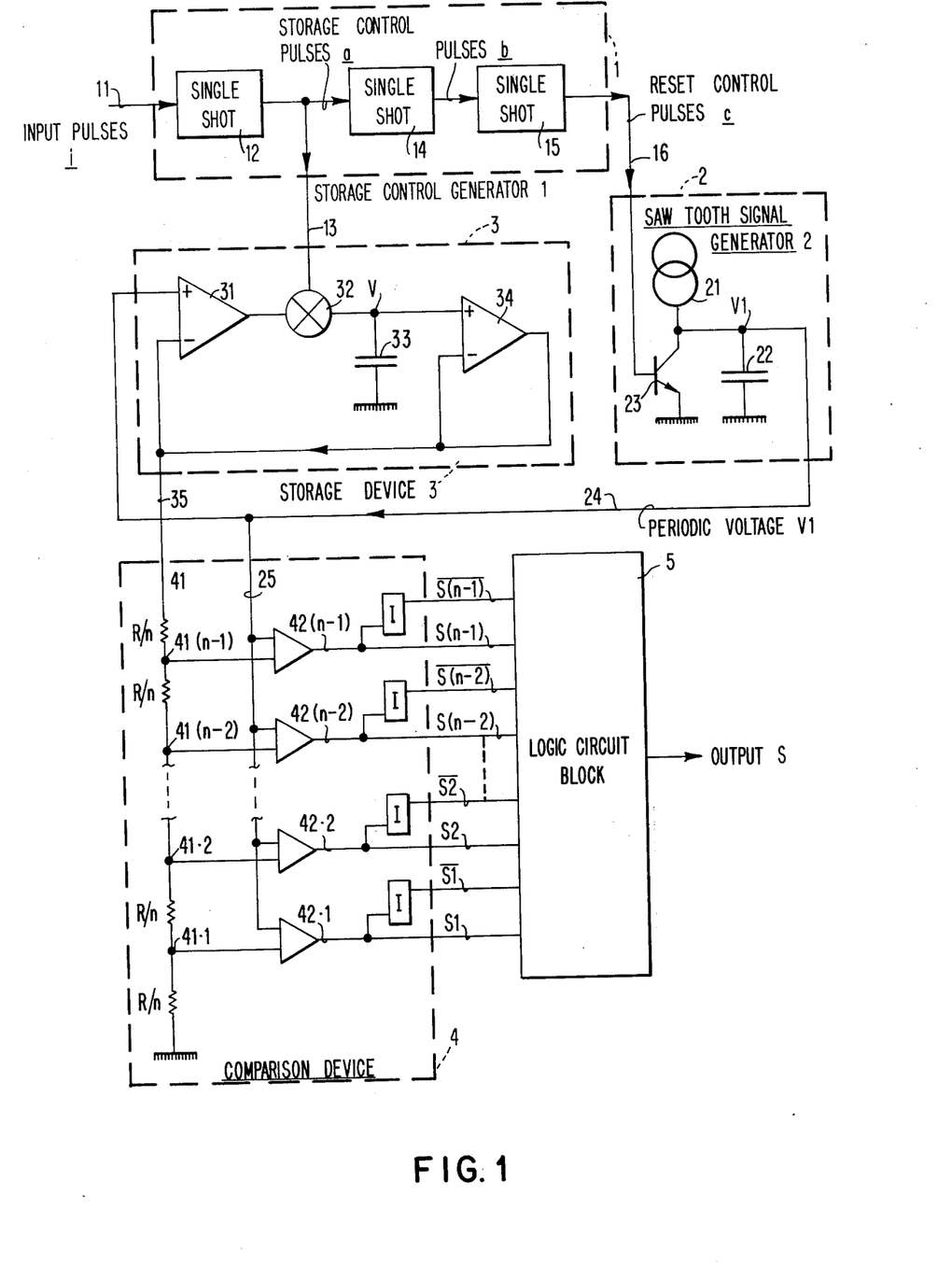
FIG. 1 is a schematic diagram of a frequency multiplier in accordance with the invention.

FIG. 1 is a schematic diagram of the frequency multiplier in accordance with the invention. A control generator 1 receives pulses $i$ the repetition period of which is equal to the period to be divided, and produces pairs of control pulses. Each pair of control pulses corresponds to an input pulse $i$ and comprises a storage control pulse $a$ and a reset control pulse $c$. The reset control pulses $c$ are sent to a sawtooth signal generator 2 which produces a periodic voltage V1 with a linear variation during each period. Through the action of each storage control pulse $a$, the voltage from the sawtooth signal generator 2 is stored in a storage device 3. Fractions of this voltage are compared with the instantaneous value of the sawtooth voltage, in a comparison device 4. The signals resulting from this comaprison are sent to a logic circuit block 5 which combines them for producing the required periodic signal output or outputs.

Figure 2:
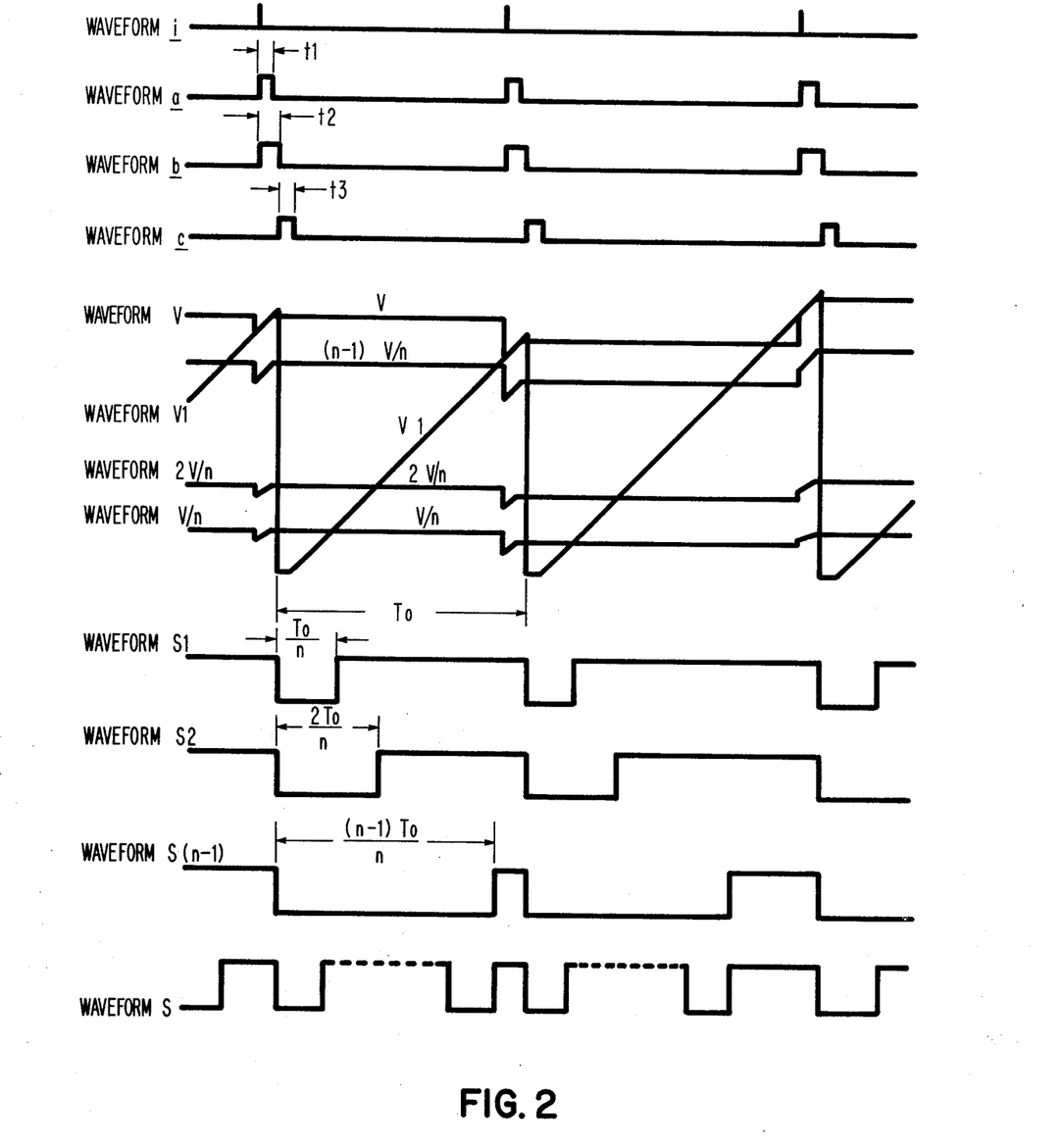
FIG. 2 illustrates the voltage variations at various points of the multiplier shown in FIG. 1.

The various elements of the multiplier and the operation thereof, will now be disclosed in detail with reference to FIGS. 1 and 2.

Control generator 1 receives input pulses $i$, through input line 11. When the signal, the frequency of which is to be multiplied, does not appear in the form of a pulse series $i$, it is easy to produce such a pulse series by any one of a number of suitable means well-known in the art. Pulses $i$ control a single-shot circuit 12 which supplies square-shaped storage control pulses $a$. The storage control pulses are transmitted to storage device 3, through line 13.

Storage control pulses $a$ are also impressed on the input of a second single-shot circuit 14 which is set by the leading edge of the pulses $a$. Single-shot 14 provides pulses $b$ the time duration of which is slightly longer than that of pulses $a$. Pulses $b$ are impressed on the input of a third single-shot 15 set by the trailing edge of the pulses $b$. Single-shot circuit 15 provides the reset control pulses $c$ for resetting generator 2, through line 16.

The relative timing of input pulses $i$, $a$, $b$ and $c$ is depicted by waveforms $i$, $a$, $b$ and $c$ of FIG. 2. The respective time-durations t1, t2 and t3 of pulses $a$, $b$, and $c$, are chosen after allowing for the following considerations:

t1, t2, and t3 must be short with respect to the time-duration of a period divided by the frequency multiplication factor;

t1 must be long enough so that the voltage reached by the sawtooth signal can be stored; t2 must be slightly longer than t1 so that the switch of the storage system has enough time to respond;

t3 must be long enough so that the sawtooth signal generator can be reset.

In practice, when the repetition period of input pulses $i$ is varying between 100µs (100 microseconds) and 10ms (10 milliseconds), t1, t2 and t3 can be given the following values:

t1 = 5µs
t2 = 6µs
t3 = 5µs

As will be readily apparent from the further description of the invention hereinafter, these values are fully sufficient to ensure a correct operation. It is to be appreciated that these values are not to be construed as a limitation relative to the practice, or embodiment, of the invention. They are merely illustrative to facilitate a ready understanding of the invention by persons skilled in the art.

Returning to FIG. 1, the sawtooth signal generator 2 will be more fully described.

The sawtooth signal generator 2 is comprised of a constant direct current source 21, a capacitor 22 connected between this source and ground, and a transistor 23 shunting said capacitor. The transistor 23 short circuits capacitor 22 when it is conductive. The base of transistor 23 is controlled by line 16 which conveys reset control pulses $c$. It will be appreciated that circuit elements of very different types may be utilized to provide a suitable sawtooth signal generator. In practice, with a frequency multiplier operating within a range of 100 Hz and 10kHz, good results can be obtained by choosing:

- a source supplying a current of 1μA;
- a capacitor of 10nF; and
- a transistor of conventional type, equivalent to an impedance of 20Ω when it is conducting.

The afore-recited conditions, are merely illustrative and are not to be construed as a limitation relative to the practice of the invention. In accordance with the afore-recited conditions the value of the voltage V1 rises linearly from approximately 0.1 volts to a magnitude approaching 10 volts. The time constant of the discharge path of the capacitor 22 is approximately 0.2μs. Thus, the time required to discharge the capacitor is much shorter than the time-duration, t3, of reset control pulse c.

The sawtooth voltage V1 is transmitted to storage device 3, through line 24. Its variation is illustrated by waveform V1 in FIG. 2.

Storage device 3 of FIG. 1 will now be more fully described. This device is of the "sample and hold" type and may be advantageously comprised of a first amplifier 31 with its positive input connected to line 24, an electronic switch 32, a capacitor 33 and a second amplifier 34. The electronic switch 32 may be a Field Effect transistor switch or a bipolar transistor switch, numerous suitable ones of which are known in the art. It is also to be noted that the output of amplifier 34 is connected to its negative input as well as to the negative input of amplifier 31. A semiconductor "sample and hold" type device in the form of an integrated circuit, such as an HA-2420 device, may be advantageously be employed.

The HA-2420 device is commercially available from Harris Semiconductor, a division of Harris Corporation. In the Harris catalog, the HA-2420 device is entitled "HA-2420/2425 Sample and Hold Gated Operational Amplifier", and described as follows:

"The HA-2420/2425 is a monolithic circuit consisting of a high performance operational amplifier with its output in series with an ultra-low leakage analog switch and a MOSFET input unity gain amplifier.

With an external holding capacitor connected to the switch output, a versatile, high performance sample-and-hold or track-and-hold circuit is formed. When the switch is closed, the device behaves as an operational amplifier and any of the standard op amp feedback networks may be connected around the device to control gain, frequency response, etc. When the switch is opened the output will remain at its last level.

The device may also be used as a versatile operational amplifier with a gated output for applications such as analog switches, peak holding circuits, etc."

The control input of such a device (control of switch 32) is connected to a line 13 which receives storage control pulses a produced by single-shot circuit 12. The output of the storage device 3 is connected to comparator 4, via line 35.

In FIG. 2, waveform V illustrates the variations in voltage of capacitor 33. The voltage V as seen from waveform V of FIG. 2 is approximately equal to the output voltage of storage device 3. For the duration of storage control pulses a switch 32 is "on". Thus, V, the stored potential of capacitor 33 assumes rapidly a voltage value equal to the voltage value V1 provided by the sawtooth generator 2. When each storage control pulse a terminates, switch 32 is turned "off", and voltage V, the charge on capacitor 33, is held to the value reached by V1 at the termination of storage pulse a. This voltage V is held due to the feedback of amplifier 34. Voltage V is maintained at this voltage value until the following storage control pulse a appears. Voltage V then assumes the voltage value reached by the sawtooth voltage V1 at that moment, a voltage value which will be different from the value it assumed at the beginning of the preceding storage control pulse a, if the time-duration of the period to be divided has varied.

In the circuit of FIG. 1, it has been assumed that the time constant for charging capacitor 33 approaches zero. This is a reasonable assumption as will be apparent to persons skilled in the art. Thus, the voltage V, the charge on capacitor 33, may be considered to assume instantaneously the voltage value of V1 when switch 32 becomes conductive. Correspondingly, it is to be recognized that the time constant for the discharge of the capacitor 33 when switch 32 is not-conducting relatively approaches infinity. Thus, the voltage V on capacitor 33, maintains the value reached at the end of storage control pulse a. These conditions, as a practical matter, are substantially fulfilled in practice. In actuality, when applying the above-mentioned values to the elements of sawtooth generator 2, the maximum value of V1 does not exceed 10 volts. Since the "sample and hold" storage device of the HA-2420 type makes a variation of 5 volts per μs possible, the charge is always achieved within a time shorter than the 5μs assumed for the duration of storage control pulse a. In addition, since the opening time of storage device 3 is 5ns, and if, as assumed above, t2 is given a value which is 1μs longer than that of t1, one is sure that the sawtooth will not reappear before the device is "off".

Returning to FIG. 1, the comparator 4 will be more fully described.

This device is comprised of a resistor 41 connected between line 35 (the output of storage device 3) and ground. Resistor 41 is employed as a voltage divider. The total value R of this resistor may be equal to, or in the order of, 10 kilohms. A number of taps $41.1, 41.2, \ldots, 41.(n-2), 41.(n-1)$ are placed on the voltage divider from which it is possible to take fractions of the voltage V applied to the voltage divider. In this illustrative example, the taps are regularly spaced so that the taken voltages are of values $V/n, 2V/n, \ldots, (n-2)V/n, (n-1)V/n$ respectively.

The taps on voltage divider 41 are respectively connected to the first voltage input of comparators $42.1, 42.2, \ldots, 42.(n-2), 42.(n-1)$. Via lead 25, these comparators respectively receive voltage V1 on their second inputs. Each of these comparators compare the ramp voltage V1, respectively impressed their second inputs, to the relatively "fixed" voltages from the respective voltage divider taps impressed on their first inputs. It will be appreciated that the relatively "fixed" voltages only vary in terms of the slow variations in the maximum value of V1. The positive (or true) outputs of the comparators referred to as $S1, S2, \ldots S(n-2), S(n-1)$, respectively, supply a signal which assumes a "high" value when voltage V1 is higher than the comparison voltage, and a "low" value when voltage V1 is lower than the comparison voltage. The negative, or complement outputs taken from inverters I, are referred to as $\overline{S1}, \overline{S2}, \ldots, \overline{S(n-2)}, \overline{S(n-1)}$, respectively, and assume values opposite the real outputs $S1, S2, \text{---} S(n-2), S(n-1)$.

FIG. 2 illustrates the voltage waveforms S1, S2, and $S(n-1)$. S1 assumes the "high" value at the end of a time-duration equal to To/n. To being the time-duration of the preceding period of the sawtooth voltage V1. S2 assumes the "high" value at the end of a time-duration equal to 2To/n. S(n−1) assumes the "high" value at the end of a time-duration equal to (n−1)To/n and keeps this value until the end of the actual period of the sawtooth voltage V1. The time during which S(n−1) assumes the "high" value is equal to To/n when the period of the sawtooth waveform is equal to the preceding one. When, as shown in the drawing, the time-duration of the actual period is different from the preceding period, the time during which S(n−1) assumes the "high" value will be either shortened or prolonged. In the drawing, as depicted in waveforms S1, S2 and S(n−1) in FIG. 2, as these differences have been exaggerated; generally, the variation will be substantially slower.

As depicted in FIG. 2, a period variation is immediately taken into account during the following period so that the system is almost instantaneously following the variations in the repetition frequency of the input pulses $i$. This feature is one of the important advantages of the invention.

Waveform S in FIG. 2 illustrates the shape, or waveform, of signal S which may be obtained by combining signals S1 with S(n−1), or their inverses. It is a periodic signal, the half period of which is equal to the nth portion of the period of the sawtooth signal. If Fo is the frequency corresponding to this period, the frequency of signal S is equal to nFo/2.

Figure 4A:
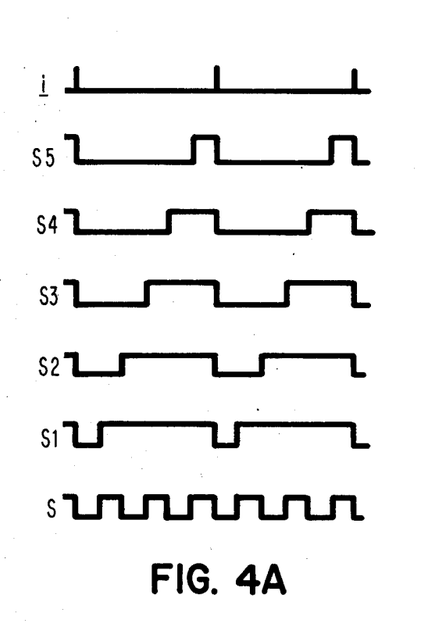
Figure 4B:
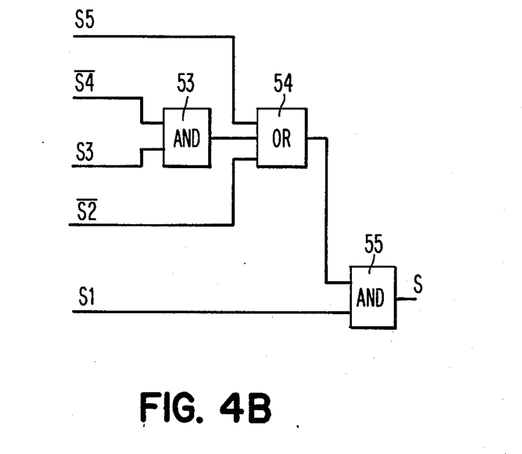
Figures 5A, 5B:
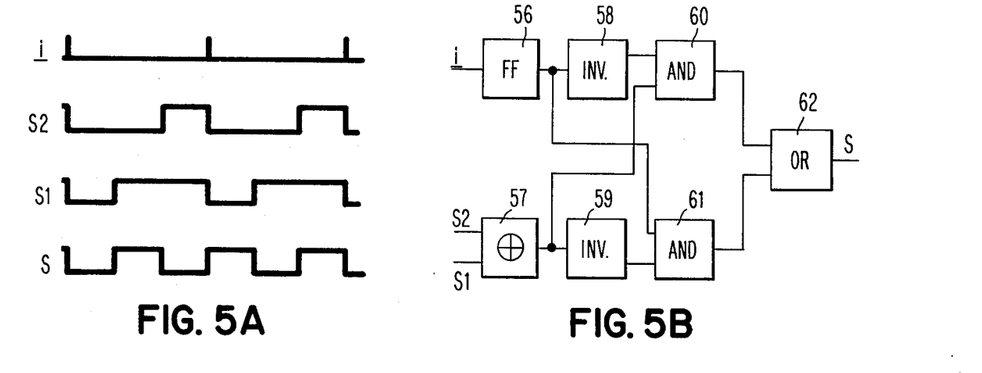

The circuits which carry out this combination are represented in FIG. 1 by logic circuit block 5. The logic design of the circuits represented by block 5 in FIG. 1, depends on the desired multiplication ratio and on the shapes of the signals to be obtained (equal or inequal alternations, etc.). By way of examples, various implementations are shown in FIGS. 3 through 5 hereof.

Figure 3A:
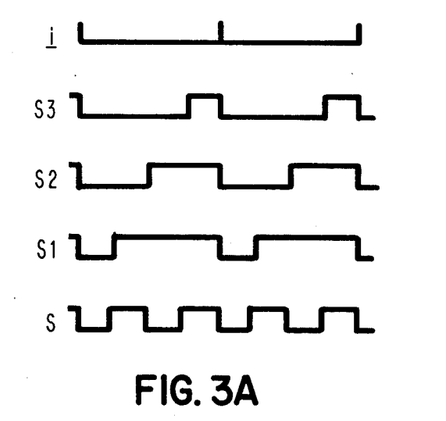
FIGS. 3A and 3B, 4A and 4B, and 5A and 5B illustrate signal combinations with which it is possible to obtain various multiplication ratios, and logic circuits for the implementation of these combinations.

FIG. 3A illustrates the output signals S1, S2 and S3 for a four-portion voltage divider. FIG. 3B illustrates a circuit which combines signals S1, S2 and S3 for the embodiment of a frequency doubler. It is apparent that, in FIG. 3A, the output signal S obtained, is given by the logic relationship:

$$S = S1\,(\overline{S2} + S3)$$

Figure 3B:
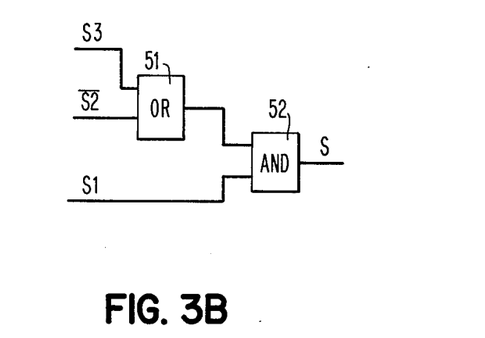

The above recited logical function is performed by means of OR circuit 51 and AND circuit 52, FIG. 3B.

In like manner, FIG. 4A illustrates the output signals S1 through S5 for a six-portion voltage divider. FIG. 4B illustrates a circuit which logically combines these signals, or their inverses, for the implementation of a frequency tripler. The logic function to be performed is:

$$S = S1\,(\overline{S2} + S3 \cdot \overline{S4} + S5)$$

The above recited logical function is performed by means of AND circuits 53 and 55 and OR circuit 54 as shown in FIG. 4B.

FIGS. 5A and 5B illustrate the performing of a frequency multiplication of 3/2 by means of a three-portion voltage divider and logic circuits. FIG. 5A illustrates the shapes of the output signals S1 and S2 of the voltage divider. This figure shows that the logic functions to be performed are by turns:

$$S = S1 \cdot \overline{S2}$$

and $$S = \overline{S1} \cdot \overline{S2} + S1 \cdot S2$$

Since combination $\overline{S1}.S2$ is never performed, the first function can be written $$S = S1 \cdot \overline{S2} + \overline{S1} \cdot S2 = S1 \oplus S2$$

$\oplus$ being representative of the EXCLUSIVE OR function.

As to the second function, it is equal to $$\overline{S1 \oplus S2}$$

The two functions can be obtained by turns by creating a signal 1 assuming alternately values 0 and 1 and by performing the function:

$$S = 1 \oplus (S1 \oplus S2)$$

FIG. 5B illustrates a circuit for implementing such a logical function. Signal 1 is produced by means of a flip-flop circuit 56 which receives input pulses $i$; the logical function (S1 ⊕ S2) is obtained by EXCLUSIVE OR circuit 57; the outputs of circuit 56 and circuit 57 are combined into an EXCLUSIVE OR circuit by means of inverters 58 and 59, AND circuits 60 and 61, and OR circuit 62.

Figure 6A:
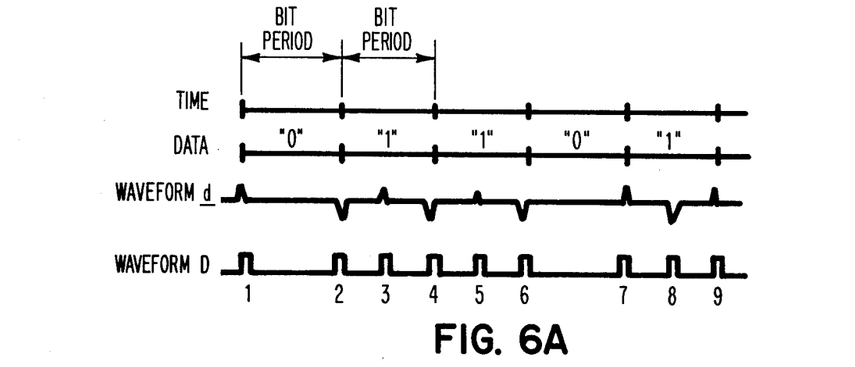
FIGS. 6A and 6B illustrate a practical application of the invention for the formation of timing signals.
Figure 6B:
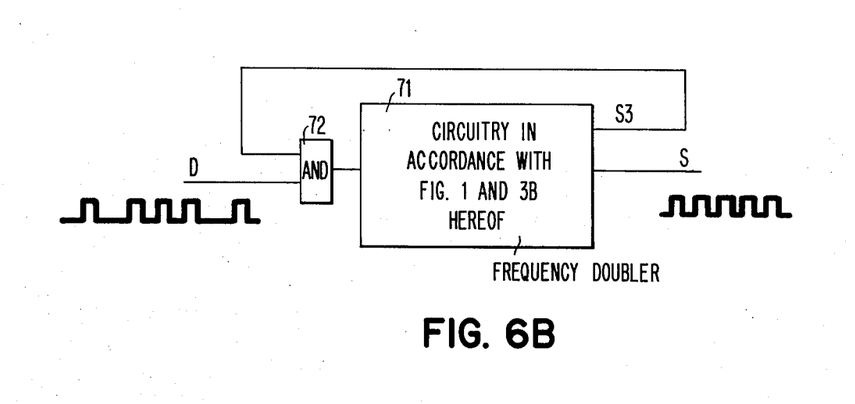

FIGS. 6A and 6B illustrate an embodiment of the frequency doubler of FIG. 3B for the generation of timing signals intended for the reading of the information stored in a moving magnetic surface store. [It is to be appreciated the "moving magnetic surface store" may be a badge for identity, entry purposes, or the like. The circuitry of FIG. 6B being employed in a reader, or terminal, in communication with a data processing system, or communication system. The foregoing is merely illustrative and should not be construed as limiting the utility and application of the invention.] The magnetic coding technique employed is the well known NRZ (non-return-to-zero) method. The third line in FIG. 6A illustrates the shapes of the signals $d$ of waveform $d$. Waveform $d$ is representative of the data to be read. These signals are formed of pulses which are positive and negative by turns. The binary bit 0 being represented by a single pulse at the beginning of a bit period. The binary bit 1 being represented by a pair of opposite polarity pulse, one pulse at the beginning of the bit period and the other one at the middle of the same period. The fourth line in FIG. 6A illustrates in waveform D the rectified pulses of waveform $d$.

The formation of the timing signals requires: removing pulses arriving at the middle of a bit period, namely pulses 3, 5 and 8 of waveform D; and creating a square wave signal with a period equal to the bit period.

These operations are achieved by the embodiment of the invention depicted in FIG. 6B. The embodiment of FIG. 6B includes a frequency doubler 71. The frequency doubler 71 is constructed in accordance with the teachings of the invention. (Reference is made to FIGS. 1 and 3B). The voltage divider being comprised of four resistors of equal value, and logic circuit block 5 being in conformity with FIG. 3B. The output S3 of the voltage divider and the rectified reading pulses D are impressed on the inputs of an AND circuit 72. The output of AND circuit 72 is impressed on the input of frequency doubler 71. Reference is made to FIG. 3A which illustrates very clearly that the reading of a binary bit "0" causes a pulse S3 (waveform S3, FIG. 3A) to be created during only the last quarter of the following bit period. Thus, when the following bit is a "1", the pulse of the mid-period will not be transmitted by AND circuit 72. It results therefrom that, subsequent to an initial binary bit "0", only the pulse at the beginning of a bit period will be transmitted to multiplier 71. Therefore, due to the fact that this novel frequency doubler follows immediately the period variations, synchronization signals are obtained from a single initial binary bit "0". This is a further very significant advantage and feature of the invention.

It is clear that the preceding description has only been given as a non-limitative example and that numerous alternatives can be considered without departing from the spirit and scope of this invention.

While the invention has been particularly described with reference to the preferred embodiment thereof, it will be understood by those skilled in the art that numerous changes in form and detail may be made without departing from the spirit and scope of the invention.

What is claimed is:

1. A frequency multiplier including in combination the following structural elements:

sawtooth signal generator means producing a sawtooth linear voltage with a frequency equal to the frequency to be multiplied, the magnitude of the sawtooth linear voltage varying between a reference magnitude and a maximum magnitude which is mathematically related to the frequency to be multiplied;

a storage device coupled to said sawtooth signal generator means for a storing voltage having a magnitude equal to said maximum magnitude;

a voltage divider coupled to said sawtooth signal generator means and said storage device, said voltage divider including a plurality of outputs, each of said outputs electrically manifesting a voltage magnitude which is a predetermined fraction of the maximum magnitude stored voltage stored by said storage device;

a number of comparators, each comparator being associated with one of the outputs of the voltage divider and coupled to said sawtooth signal generator means, each comparator comparing the instantaneous magnitude of the sawtooth voltage with the magnitude of the voltage manifested at its associated voltage divider output, each comparator supplying a first level signal when the sawtooth voltage is higher in magnitude than the magnitude of the voltage manifested at its associated divider output and, a second level signal when the sawtooth voltage is lower in magnitude than the magnitude of the voltage manifested at its associated divider output; and logic circuit means, coupled to said number of comparators, said logical circuit means logically combining the signals from said number of comparators to provide an output signal the basic time-period of which is a given sub-multiple of the time-period of the sawtooth signal.

2. A frequency multiplier according to claim 1, further characterized in that said sawtooth signal generator means includes a pulse generator for producing pulse pairs, each pulse of each pulse pair being closely displaced in time one to another, the frequency of each pulse pair being equal to the frequency to be multiplied, the first pulse in each pulse pair controlling the storage of the maximum magnitude of the sawtooth voltage by said storage device, and the second pulse in each pulse pair controlling the return of the sawtooth voltage to the reference magnitude by the sawtooth generator means.

3. A frequency multiplier according to claim 2, further characterized in that the storage device is comprised of a capacitor and an electronic switch, said capacitor receiving the sawtooth voltage via said electronic switch during the time period of the first pulse in each pulse pair.

4. A frequency multiplier according to claim 3, further characterized in that the electronic switch is a field effect transistor switch.

5. A frequency multiplier according to claim 3, further characterized in that the electronic switch is a bipolar transistor switch.

6. A frequency multiplier according to claim 3, further characterized in that said pulse generator has an input terminal adapted to receive a signal the frequency of which is to be multiplied, said signal the frequency of which is to be multiplied being formed of a series of input pulses, said input pulses having a repetition frequency constituting the frequency to be multiplied, and said pulse generator in response to each said input pulse forms and provides one of said pulse pairs.

7. A timing signal generator receiving data pulses with a time position which depends on a basic cycle of variable duration, a pulse being received at the beginning of each cycle and in the middle of at least one of said cycles, said timing generator producing a series of timing oscillations each said timing oscillation having a time period which is equal to one-half of one of said cycles, said timing signal generator comprising in combination the following structural elements:

a frequency doubler according to claim 6, wherein the voltage divider includes among said plurality of outputs, a three quarter output for electrically manifesting a voltage whose magnitude is three quarters of the maximum magnitude stored voltage stored by said storage device, the three-quarter comparator and said logic circuit means associated with said three quarter output providing a first signal during the last quarter of each of said time periods; and a two input AND logic circuit for receiving said first signal from said three-quarters comparator and said logic circuit means and said data pulses, said two input AND logic circuit producing an output signal when a data pulse is coincident with said first signal, said AND logic circuit output being utilized as the input to the frequency doubler.

8. A frequency multiplier particularly adapted to respond to a variation in the pulse repetition rate between successive pulses of an input pulse train having a pulse repetition rate subject to variation, said frequency multiplier including: sawtooth voltage generator means responsive to said input pulse train having a repetition rate subject to variation, said sawtooth voltage generator means providing a sawtooth voltage waveform wherein the maximum voltage magnitude of each sawtooth bears a direct fixed mathematical relationship to the repetition rate of predetermined first and second ones of said pulses of said input pulse train;

voltage storage means coupled to said sawtooth generator means, said voltage storage means successively sensing and storing the maximum voltage magnitude of each successive sawtooth of said sawtooth voltage waveform;

voltage comparison means coupled to sawtooth voltage generator means and said voltage storage means, said voltage comparison means successively comparing the successive magnitudes of the voltage stored in said storage means with the instantaneous voltage value of the sawtooth following in time the sawtooth whose maximum voltage magnitude is stored in said storage means;

logical circuit means coupled to said voltage comparison means, said logical circuit means being response to said voltage comparison means to provide an output pulse train having a repetition rate bearing a fixed predetermined mathematical relationship with the pulse repetition rate of said input pulse train, whereby the pulse repetition rate of said output pulse train tracks the pulse repetition rate of said input pulse train.

9. A frequency multiplier as recited in claim 8 wherein the sawtooth generator means comprises:

a first single shot circuit having an input and an output, said input of said first single shot circuit being adapted to receive said input pulse train;

a second single shot circuit having an input and an output, said input of said second single shot circuit being connected to said output of said first single shot circuit;

a third single shot circuit having an input and an output, said input of said third single shot circuit being connected to said output of said second single shot circuit;

a sawtooth signal generator including a transistor having a collector, base and emitter, the collector of said transistor being connected to a current source, the base of said transistor being connected to said output of said third single shot circuit and the emitter of said transistor being connected to a source of reference potential, a capacitor connected between said collector of said transistor and said source of reference potential, said sawtooth signal generator having an output terminal connected to the common juncture of said collector of said transistor and said capacitor.

10. A frequency multiplier as recited in claim 9 wherein the voltage storage means comprises:

a first amplifier having a positive input, a negative input, and an output;

a second amplifier having a positive input, a negative input and an output;

an electronic switch having an input connected to the output of said first amplifier, a control input connected to the output of said first single shot circuit and an output connected to the positive input of said second amplifier;

a capacitor connected between said output of said electronic switch and said source of reference potential;

first connection means directly connecting said positive input of said first amplifier with said output terminal of said sawtooth signal generator;

said voltage storage means having an output terminal;

and second connection means directly connecting in common said output of said second amplifier, said negative input of said second amplifier, negative input of said first amplifier and said output terminal of said voltage storage means.

11. A frequency multiplier as recited in claim 10 wherein the voltage comparison means comprises:

a resistor having at least first and second taps, said resistor being connected between said output terminal of said voltage storage means and said source of reference potential;

at least first and second comparison circuits, each comparison circuit having a first input, a second input and an output;

third connection means connecting in common said first input of said first comparison circuit, said first input of said second comparison circuit and said output of said sawtooth signal generator;

and second connection means respectively connecting said second input of said first comparison circuit to said first tap on said resistor, and said second input of said second comparison circuit to said second tap on said resistor.

12. A frequency multiplier as recited in claim 11 wherein said logical circuit means has at least two inputs respectively connected to said outputs of said at least two comparison circuits and at least one output at which said output pulse train is electrically manifested.

13. In a reader for reading magnetically encoded data on a record medium, where the reading of the magnetically encoded data requires relative motion between the record medium and a reading means, and the relative motion is subject to wide variation in the rate of movement, the provision of a timing circuit responsive to data read by said reading means to provide timing signals bearing a fixed time relationship to the reading of said data, said timing circuit comprising:

a logical AND circuit having at least a first input, a second input and an output;

a frequency doubler circuit in accordance with claim 8 wherein said doubler circuit includes an input for receiving said input pulse train having a pulse repetition rate subject to variation, a first output for providing said output pulse train having a pulse repetition rate bearing a fixed mathematical relationship with the pulse repetition rate of said input train, said frequency doubler circuit further including additional means for providing a further pulse train having a pulse repetition rate bearing a second fixed mathematical relationship with the pulse repetition rate of said input train;

a logical AND circuit having a first input adapted to receive signals representative of said data read by said reading means, a second input adapted to receive said further pulse train from said frequency doubler circuit, and an output for providing said input pulse train to the said input of said frequency doubler circuit;

whereby said output pulse train constitutes said timing signals which are continuously synchronized with the reading of the encoded data from the record medium.

14. In a reader for reading magnetically encoded data on a record medium as recited in claim 13 where said read medium is an identification badge, entry badge, or the like and said magnetically encoded data carried by said badge, or the like is magnetically encoded in accordance with the known non-return to zero method of magnetically encoding data.

15. In a reader for reading magnetically encoded data on a record medium, where the reading of the magnetically encoded data requires relative motion between the record medium and a reading means, and the relative motion is subject to wide variation in the rate of movement, the provision of a timing circuit responsive to data read by said reading means to provide timing signals bearing a fixed time relationship to the reading of said data, said timing circuit comprising:
- a logical AND circuit having at least a first input, a second input and an output;
- a frequency doubler circuit in accordance with claim 12 wherein said doubler circuit includes an input for receiving said input pulse train having a pulse repetition rate subject to variation, a first output for providing said output pulse train having a pulse repetition rate bearing a fixed mathematical relationship with the pulse repetition rate of said input train, said frequency doubler circuit further including additional means for providing a further pulse train having a pulse repetition rate bearing a second fixed mathematical relationship with the pulse repetition rate of said input train;
- a logical AND circuit having a first input adapted to receive signals representative of said data read by said reading means, a second input adapted to receive said further pulse train from said frequency doubler circuit, and an output for providing said input pulse train to the said input of said frequency doubler circuit;
- whereby said output pulse train constitutes said timing signals which are continuously synchronized with the reading of the encoded data from the record medium.

16. In a reader for reading magnetically encoded data on a record medium, where the reading of the magnetically encoded data requires relative motion between the record medium and a reading means, and the relative motion is subject to wide variation in the rate of movement, the provision of a timing circuit responsive to data read by said reading means to provide timing signals bearing a fixed time relationship to the reading of said data, said timing circuit comprising:
- a logical AND circuit having at least a first input, a second input and an output;
- frequency doubler circuit means, said frequency doubler circuit means includes, an input for receiving an input pulse train having a pulse repetition rate subject to variation, a first output for providing an output pulse train having a pulse repetition rate bearing a fixed mathematical relationship with the pulse repetition rate of said input train, said frequency doubler circuit means further including additional means for providing a further pulse train having a pulse repetition rate bearing a second fixed mathematical relationship with the pulse repetition rate of said input train;
- a logical AND circuit having a first input adapted to receive signals representative of said data read by said reading means, a second input adapted to receive said further pulse train from said frequency doubler circuit means, and an output for providing said input pulse train to the said input of said frequency doubler circuit means;
- whereby said output pulse train constitutes said timing signals which are continuously synchronized with the reading of the encoded data from the record medium.

* * * * *